(12) United States Patent
Yegingil et al.

(10) Patent No.: US 8,143,765 B1
(45) Date of Patent: Mar. 27, 2012

(54) SELF-POWERING HEADSET, DEVICES AND RELATED METHODS

(75) Inventors: Hakki Yegingil, Philadelphia, PA (US); John-Paul McGovern, Philadelphia, PA (US); Sabine Ohler, New York, NY (US); Daniel DeClement, New York, NY (US); Christian L. Martorano, Marlton, NJ (US); Huidong Li, Marlton, NJ (US); Joseph Capobianco, Marlton, NJ (US); Matthew H. Foster, Marlton, NJ (US); Richard Martorano, Singapore (SG)

(73) Assignee: TBT Group, Inc., New York, NY (US)

( * ) Notice: Subject to any disclaimer, the term of this patent is extended or adjusted under 35 U.S.C. 154(b) by 305 days.

(21) Appl. No.: 12/363,245

(22) Filed: Jan. 30, 2009

Related U.S. Application Data

(60) Provisional application No. 61/062,927, filed on Jan. 30, 2008, provisional application No. 61/148,360, filed on Jan. 29, 2009.

(51) Int. Cl.
*H01L 41/107* (2006.01)
*H02N 2/18* (2006.01)

(52) U.S. Cl. .......................... 310/339; 310/330; 310/331

(58) Field of Classification Search .................. 310/339
See application file for complete search history.

(56) References Cited

U.S. PATENT DOCUMENTS

| | | | | |
|---|---|---|---|---|
| 5,801,475 | A * | 9/1998 | Kimura | 310/339 |
| 6,995,496 | B1 * | 2/2006 | Hagood et al. | 310/339 |
| 2008/0074002 | A1 * | 3/2008 | Priya et al. | 310/339 |
| 2009/0174361 | A1 * | 7/2009 | Duron et al. | 320/101 |

* cited by examiner

*Primary Examiner* — Jaydi San Martin
(74) *Attorney, Agent, or Firm* — K&L Gates LLP

(57) ABSTRACT

In one aspect, the invention relates to a headset that includes an element that generates energy in response to forces. The headset includes at least one vibratable piezoelectric element; a first circuit element in electrical communication with the at least one vibratable piezoelectric element; and a signal processing element, the signal processing element disposed within the headset and at least partially energized by mechanical changes in the vibratable piezoelectric element.

5 Claims, 14 Drawing Sheets

SELF-POWERING HEADSET, DEVICES AND RELATED METHODS

CROSS REFERENCE TO RELATED APPLICATIONS

This application claims priority to and the benefit of U.S. Provisional Application No. 61/148,360, filed Jan. 29, 2009, and U.S. Provisional Application No. 61/062,927, filed Jan. 30, 2008, the disclosures of each of which are herein incorporated by reference in their entireties.

FIELD OF INVENTION

The invention generally relates to energy harvesting using piezoelectric devices. It more specifically relates to a method and device for harvesting the energy using one or more piezoelectric elements containing piezoelectric cantilevers.

BACKGROUND OF THE INVENTION

Energy harvesting is a growing area of interest because of the high demand for powering wireless sensors by eliminating the battery or by charging the current battery continuously so that there would be no need to change the battery after it discharges. There are many ways to harvest the ambient energy; via an electric field (electrostatic), magnetic field (electromagnetic), thermal energy (thermoelectric) or vibrational energy (piezoelectric).

Wireless headsets are used with all manner of mobile devices and receiver systems. However, none of the systems for energy harvesting aims to power a headset unit by harvesting the energy from the vibrations caused by the user or coming from the environment. Thus, a system for powering a headset unit using piezoelectric elements is needed.

SUMMARY OF THE INVENTION

In one aspect, the invention relates to a device (and related power generating methods) which can be attached to or included within a headset and that can energize the headset and permit extended use by an end-user without needing to recharge the device or change the battery. In one embodiment, the headset operates by harvesting the vibrations caused by the user or coming from the environment and by converting these vibrations to electrical energy using the piezoelectric elements in the device.

In another aspect, the invention provides a headset. The headset can include a housing having a first surface and a second surface; a first piezoelectric element having a first dimension and which is disposed in the housing; an energy harvesting circuit in electrical communication with the first piezoelectric element; and a signal processing element which is disposed within the headset and which is at least partially energized by mechanical changes in the piezoelectric element. The first surface of the housing defines a region that is sized to allow acoustic waves to pass through that region, and the energy harvesting circuit can include a first circuit element is in electrical communication with the first piezoelectric element. In some embodiments, the first dimension of the first piezoelectric element ranges from about 10 mm to about 60 mm. In some embodiments, the first circuit element is a rectifying circuit element.

In some embodiments, the headset further includes a battery having a charge level. The battery is in electrical communication with the first piezoelectric element, and the first piezoelectric element is positioned relative to the housing such that movement of the headset increases the charge level of the battery.

In some embodiments, the first piezoelectric element includes a piezoelectric cantilever, and the piezoelectric cantilever is composed of, for example, a polycrystalline lead magnesium niobate-lead titanate ceramics material. In some embodiments, the first piezoelectric element has a plurality of piezoelectric cantilevers, and each of the plurality of cantilevers is composed of, for example, a polycrystalline lead magnesium niobate-lead titanate ceramics material.

In some embodiments, the first piezoelectric element includes a first piezoelectric layer and a second piezoelectric layer. A non-piezoelectric layer is disposed (e.g., sandwiched) between the first and second piezoelectric layers.

In various embodiments, the first piezoelectric element can be a vibratable piezoelectric element. The vibratable piezoelectric element can be composed of, for example, a polycrystalline lead magnesium niobate-lead titanate piezoelectric material. In some embodiments, the polycrystalline lead magnesium niobate-lead titanate piezoelectric material has a density that ranges from about 7.6 grams/cc to about 8.0 grams/cc and can be, for example, about 7.8 grams/cc. In some embodiments, the polycrystalline lead magnesium niobate-lead titanate piezoelectric material has an average grain size of about 4.3 microns.

In some embodiments, the headset further includes a stopper positioned relative to the first piezoelectric element such that the vibration amplitude of the first piezoelectric element is constrained by the stopper.

In some embodiments, the first piezoelectric element comprises a plurality of layers such that an electrode is disposed within the piezoelectric element, and the electrode sandwiched between at least two of the layers.

In a further aspect, the invention provides a method of energizing a headset. The method can include the steps of vibrating a piezoelectric cantilever, the cantilever being positioned relative to a housing of a headset; generating electric charge in a region proximate to a portion of the headset in response to the vibrating piezoelectric cantilever; converting the charge into a useable current form by at least one headset circuit element; and powering the headset for a period of time t using the useable current form. In some embodiments, the method can include the further step of providing a piezoelectric cantilever comprising a piezoelectric material and the further step of selecting the piezoelectric material such that the piezoelectric material is composed of a polycrystalline lead magnesium niobate-lead titanate ceramic having a density that ranges from about 7.6 grams/cc to about 8.0 grams/cc. In some embodiments, the period of time t ranges from about 0.1 seconds to greater than one hour. In some embodiments, the method further includes the step of generating random voltage signals from the piezoelectric cantilever and rectifying the random signals to produce a direct current.

In yet another aspect the invention provides a piezoelectric headset power source. The piezoelectric headset power source can include a mounting surface, the mounting surface being sized to fit within the headset housing; a plurality of cantilevers, the plurality of cantilevers substantially secured to the mounting surface and arranged such that the plurality of cantilevers can vibrate and produce an aggregate electric charge flow; and an energy harvesting circuit, the energy harvesting circuit comprising a first circuit element, the first circuit element receives the aggregate electric charge flow and converts the aggregate electric charge flow such that a current suitable for powering the headset is generated. In some embodiments, the plurality of cantilevers are arranged in overlapping stepped layers of varying lengths. In some embodiments, the plurality of cantilevers are composed of, for example, a polycrystalline lead magnesium niobate-lead titanate piezoelectric material. In some embodiments, the polycrystalline lead magnesium niobate-lead titanate piezoelectric material has a density that ranges from about 7.6 grams/cc to about 8.0 grams/cc and can be, for example, about 7.8 grams/cc. In some embodiments, the polycrystalline lead magnesium niobate-lead titanate piezoelectric material has an average grain size of about 4.3 microns.

In one aspect, the invention relates to manufacturing polycrystalline lead magnesium niobate-lead titanate (PMN-PT) piezoelectric materials using a processing method amenable to large scale and high yield manufacturing. As a result, the invention relates in part to providing a superior piezoelectric material while being economically feasible.

In another aspect, the invention offers improved ceramic materials and enhanced production yields as a result of discoveries relating to sintering temperatures. In some embodiments, the sintering step is performed at a temperature greater than or substantially equal to about 1100 degrees Celsius. As a result, in some embodiments, low temperature fabrication has been determined to be ineffective and high temperature sintering is preferred. In one embodiment, the sintering temperature ranges from about 1050° C. to about 1150° C. More preferably, the sintering temperature ranges from about 1125° C. to about 1150° C.

In one aspect, the methods of fabricating piezoelectric materials include the use of a low molecular weight dispersing resin having a molecular weight that ranges below about 10,000 and is typically in the range of from about 4,000 to about 7,000.

In another aspect, the invention relates to a method of manufacturing, polycrystalline lead magnesium niobate-lead titanate piezoelectric material. The method includes the steps of preparing a dispersion vehicle with a ceramic powder, a polymeric binder, and a solvent, wherein the ceramic powder includes at least lead(II) oxide, niobium(V) oxide, magnesium hydroxide, and lead titanate, and wherein the polymeric binder includes at least a low molecular weight acrylic resin and a high molecular weight acrylic resin; processing the ceramic powder, the polymer binder, and the solvent into a ceramic slurry in the dispersion vehicle; casting the ceramic slurry into a ceramic tape by drawing the ceramic slurry through a metering device into a continuous film; laminating the ceramic tape; removing the polymeric binder from the ceramic tape; and sintering the ceramic tape to provide a polycrystalline lead magnesium niobate-lead titanate piezoelectric material. In one embodiment, the piezoelectric ceramic material is substantially pyrochlore-free. In another embodiment, the sintering step provides a polycrystalline lead magnesium niobate-lead titanate piezoelectric material that is substantially pyrochlore-free.

In another aspect, the invention relates to a piezoelectric ceramic material. The material includes a polycrystalline lead magnesium niobate-lead titanate material, wherein the polycrystalline material has an average grain size of about 4.3 microns, and wherein the material has a density range from about 7.6 grams per cubic centimeter to about 8.0 grams per cubic centimeter. In one embodiment, the polycrystalline lead magnesium niobate-lead titanate is substantially pyrochlore-free.

In another aspect, the invention relates to an electronic device. The device includes a power generating element; and a user interface component, wherein the power generating element comprises a polycrystalline lead magnesium niobate-lead titanate material, wherein the polycrystalline material has an average grain size of about 4.3 microns, and wherein the material has a density range from about 7.6 grams per cubic centimeter to about 8.0 grams per cubic centimeter. In one embodiment, the electronic device is a mobile device selected from the group consisting of a phone, a personal digital assistant, a watch, a content player, an mp3 shuffle device, an mp3 player, a camera, a headset, a shaver, a toothbrush, and a toy.

It is an object of this invention to provide a scheme of powering the headset using the piezoelectric element. In one embodiment, the headset will be solely powered by the piezoelectric element and the battery will be eliminated. In contrast, in another embodiment, the power generating portion of the headset will supply power to the battery of the headset thereby extending the intervals between charging. In this embodiment, the need for charging the battery can also be eliminated.

It is further an object of this invention to provide a scheme of connecting a piezoelectric element to the headset unit.

It is further an object of this invention to describe the components of a piezoelectric cantilever, and its dimensions.

It is further an object of this invention to describe different geometries of piezoelectric cantilevers.

It is further an object of this invention to describe components used to energize a headset, such as a wireless headset, using piezoelectric element.

It is further an object of this invention to describe a piezoelectric element embedded inside the headset unit.

It is further an object of this invention to describe a piezoelectric element attached next to the headset unit. This may include embodiments wherein one or more piezoelectric elements are external to headset housing. In one embodiment, the housing typically includes a signal processing element such as digital signal processor, a microphone, a speaker, or another device that generates and input or output in response to a signal.

It is further an object of this invention to describe a headset embodiment developed to charge the headset's battery while the user carries the headset or puts it on the table.

It is a feature of this invention that the headset unit includes a piezoelectric element, which can harvest the vibrations caused by the user or originating from the environment and converts these vibrations into electrical energy by using the piezoelectric cantilevers inside the piezoelectric element.

It is an advantage of this invention that the power generated by the piezoelectric element can enable the headset user to use the headset for longer times without charging its battery or even to use the headset without ever connecting it to a charging adapter. In another embodiment, the invention relates to an adapter module that can convert a conventional headset into a self-powering headset.

All these objects, features and advantages of the invention use one or more piezoelectric elements embedded in (or otherwise disposed within) the headset unit or attached next to the headset unit. The function of the piezoelectric element depends on the number of piezoelectric elements used for the headset unit. In other embodiments, it can be a function of the number of the piezoelectric cantilevers used. The number of piezoelectric elements disposed within the headset unit or attached next to the unit and the number of the piezoelectric cantilevers can be adjusted so that they can supply additional power to the main battery when the vibration is mild or the unit is not attached to the ear. Further, it can charge the battery in full and supply additional power needed for the headset unit when the vibrations are strong enough or the additional power can be supplied to an optional mobile device or a cell phone, if needed. In other embodiments, the number of piezoelectric elements embedded in the headset or positioned near it can be adjusted so that the battery can be eliminated from the headset unit and the unit can be powered solely by the piezoelectric element converting the vibrations into electrical energy.

Embodiments of the invention also include a circuit that converts and stores (up to some capacity) the electrical energy produced by the piezoelectric element. Various circuits and application specific integrated circuits can be used in suitable embodiments. In one embodiment, the circuit has a built-in rectifier that converts signals coming from the piezoelectric element to DC voltage. In some embodiments, the converted DC Voltage is stored in a capacitor that is an element in a circuit. The circuit can contain a DC-DC step down voltage converter to change the voltage to the level at which the circuit or the battery of the circuit operates. In one embodiment the circuit uses synchronous rectifiers to convert the signal from the piezoelectric element to DC voltage. The circuit can also contain a boost controller and also a microcontroller to control the boost converter.

The details of one or more embodiments of the invention are set forth in the accompanying drawings and the description below. Other features, objects, and advantages of the invention will be apparent from the description, drawings and examples, and from the claims.

BRIEF DESCRIPTION OF THE DRAWINGS

Reference to the figures herein is intended to provide a better understanding of the methods and apparatus of the invention but is not intended to limit the scope of the invention to the specifically depicted embodiments. The drawings are not necessarily to scale, emphasis instead being placed upon illustrating the principles of the invention. Like reference characters in the respective figures typically indicate corresponding parts.

12a and 12b, during walking with the embodiment and while the embodiment is sitting on the table.

Figure 14:
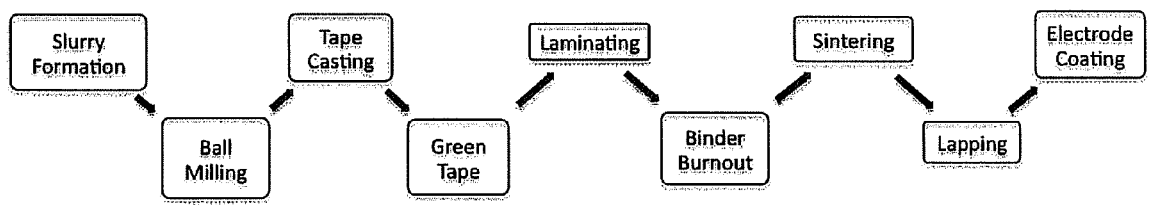

FIG. 14 is a process flow showing the steps of an exemplary fabrication process from slurry formation to electrode coating in accordance with an embodiment of the invention.

DETAILED DESCRIPTION

The invention will be more completely understood through the following detailed description, which should be read in conjunction with the attached drawings. Detailed embodiments of the invention are disclosed herein, however, it is to be understood that the disclosed embodiments are merely exemplary of the invention, which may be embodied in various forms. Therefore, specific functional details disclosed herein are not to be interpreted as limiting, but merely as a basis for the claims and as a representative basis for teaching one skilled in the art to variously employ the invention in virtually any appropriately detailed embodiment.

It should be understood that the order of the steps of the methods of the invention is immaterial so long as the invention remains operable. Moreover, two or more steps may be conducted simultaneously unless otherwise specified. In addition, it should be understood that the terms "a," "an," and "the" mean "one or more," unless expressly specified otherwise.

Prior to describing different aspects and embodiments of the invention in detail, an introduction to some of the characteristic terminology used herein may prove informative. However, the scope of the terms discussed herein is not intended to be limiting, but rather to clarify their usage and incorporate the broadest meaning of the teens as known to those of ordinary skill in the art. One of the piezoelectric materials described in more detail below is one or more types of PMN-PT material. PMN-PT refers to lead magnesium niobate-lead titanate, whether in the poly-crystal or single crystal form. PZT is another type of piezoelectric materials suitable for use in various embodiments. PZT refers to lead zirconate titanate. As used herein, a piezoelectric element can be a member or structure that includes a piezoelectric material, or an overall component that itself includes other piezoelectric elements. Thus, a cantilever is a type of piezoelectric element. Further, a power generating element that includes a plurality of cantilevers or other individual piezoelectric elements can also, itself, be a piezoelectric element.

The present invention relates to methods of powering a headset unit, such as, but not limited to a wireless headset, a noise-canceling headset, or a Bluetooth headset, using piezoelectric elements. The invention relates to various power generating devices as well as individual headset embodiments.

Typically, a regular headset uses a rechargeable Li-ion battery, which has limited stand-by time and talking hours due to the weight and spacing constraints of the headset unit and internal battery. Also, the limited battery life of the headset unit makes the product less mobile and in need of frequent charging. This requires carrying the power adapter of the headset unit, which usually is a few times bigger than the headset unit itself. All these restrictions make a headset unit less mobile, which is ironic as it is designed for a mobile lifestyle. By incorporating piezoelectric elements, such as a plurality of piezoelectric cantilevers, a piezoelectric stack, or other piezoelectric components as described herein within the housing of a headset, a self powering headset can be implemented.

Figure 1A:
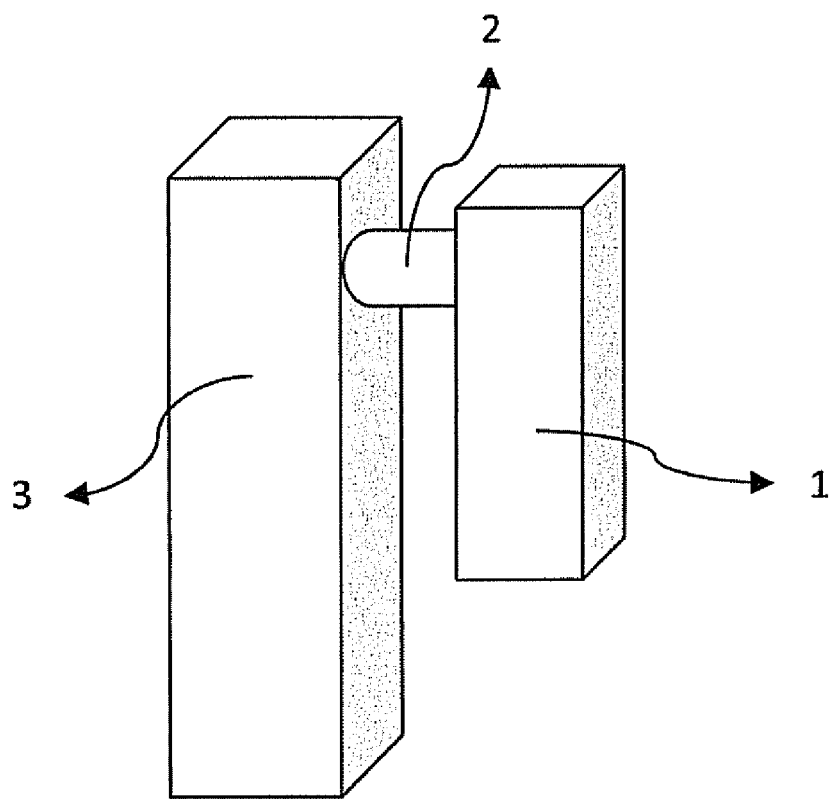
FIG. 1a is a perspective view of a piezoelectric element attached to the side of the headset unit in accordance with an embodiment of the invention.

An exemplary self-powering headset is shown in FIG. 1a. As shown in FIG. 1a, the piezoelectric element 1 is attached next to the headset unit 3 via a special adapter 2. This would be the case when the piezoelectric element has a volume such that it would not fit inside the headset unit or it would be an optional adapter to be attached to the headset unit.

Figure 1B:
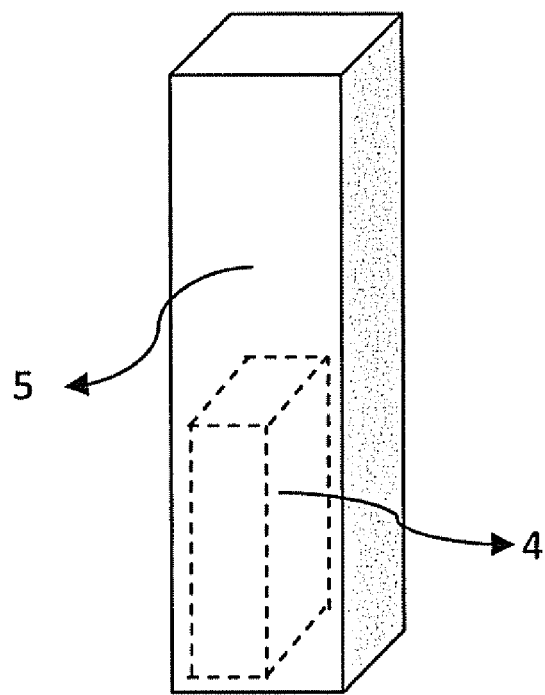
FIG. 1b is a perspective view of a piezoelectric element disposed inside the headset unit in accordance with an embodiment of the invention.

As shown in FIG. 1b, the piezoelectric element 4 is disposed inside the headset unit 5, within the inner housing surface. That is disposed, at least in part, within the housing of the headset. The piezoelectric element's volume can be adjusted so that it can fit either into the headset unit 5 or can be attached next to the headset unit 5. Typically, the housing is a suitable shell that fits around a speaker, a microphone, and other constituent electronics of the headset. With respect to FIG. 1b, such an embodiment is suitable when the piezoelectric element 4 has a volume such that it would fit inside the headset unit 5 and be a part of the headset unit.

Figure 2:
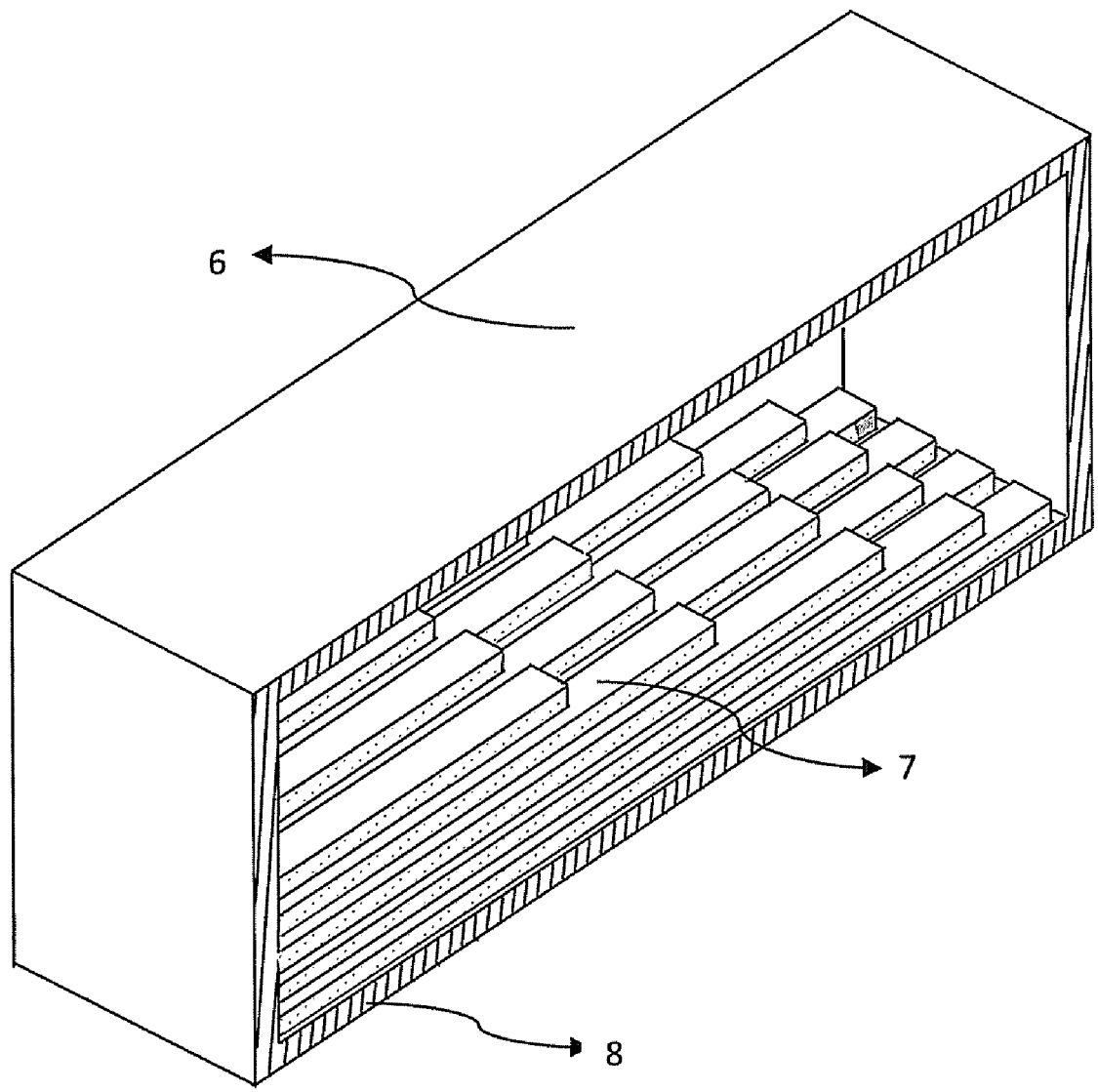
FIG. 2 is a perspective view of an example of a piezoelectric power generating element suitable for inclusion or attachment to a headset in accordance with an embodiment of the invention.

As shown in FIG. 2, a piezoelectric power generating element or piezoelectric element 6, which can include a piezoelectric material, or one or more identical or different piezoelectric elements is shown. In this piezoelectric cantilever-based embodiment, different layers of piezoelectric cantilevers 7 are shown. In this example, the piezoelectric element (alternatively power generating element) 6 includes a plurality of piezoelectric cantilevers of different lengths 7, which perform with substantially maximum efficiency at different vibration frequencies, as shown in FIG. 2. The number of piezoelectric cantilevers 7 is a function of the power required and the space available within the piezoelectric element 6. FIG. 2 shows a cross sectional view of the piezoelectric element. The cross section of the piezoelectric element wall 8 is also shown in FIG. 2. The electrical connections to element 6 are not shown. The piezoelectric cantilevers 7 are secured at the one end and kept free at the other end so that they can capture the vibration coming from the environment. This configuration also helps maintain the cantilever geometry.

The cantilevers 7 shown in FIG. 2 are horizontally oriented, although it is not shown herein, in another embodiment some cantilevers 7 might be vertically oriented or oriented with some angular degree depending on the directions of the strongest vibrations of a particular headset unit application. In addition, stoppers can be fabricated using suitable materials, such as materials having a suitable hardness or softness. These stoppers or stops can be positioned at specific points in or near a piezoelectric element 6, such as proximate to a piezoelectric cantilever 7. The stoppers can limit the vibration amplitude of the free end of one or more piezoelectric cantilevers 7 within a particular electricity generating element. Further, stoppers and other fabricated static or elastic elements can be positioned to control the modes of vibration associated with a given cantilever 7. In general, embodiments of the invention include one or more piezoelectric cantilevers 7, or other suitable geometries, as appropriate to power a headset. As shown in FIG. 2, the cantilevers 7 are arranged in a stepped pattern to increase the number of cantilevers 7 in a given volume while enhancing their individual ability to vibrate.

Figure 3:
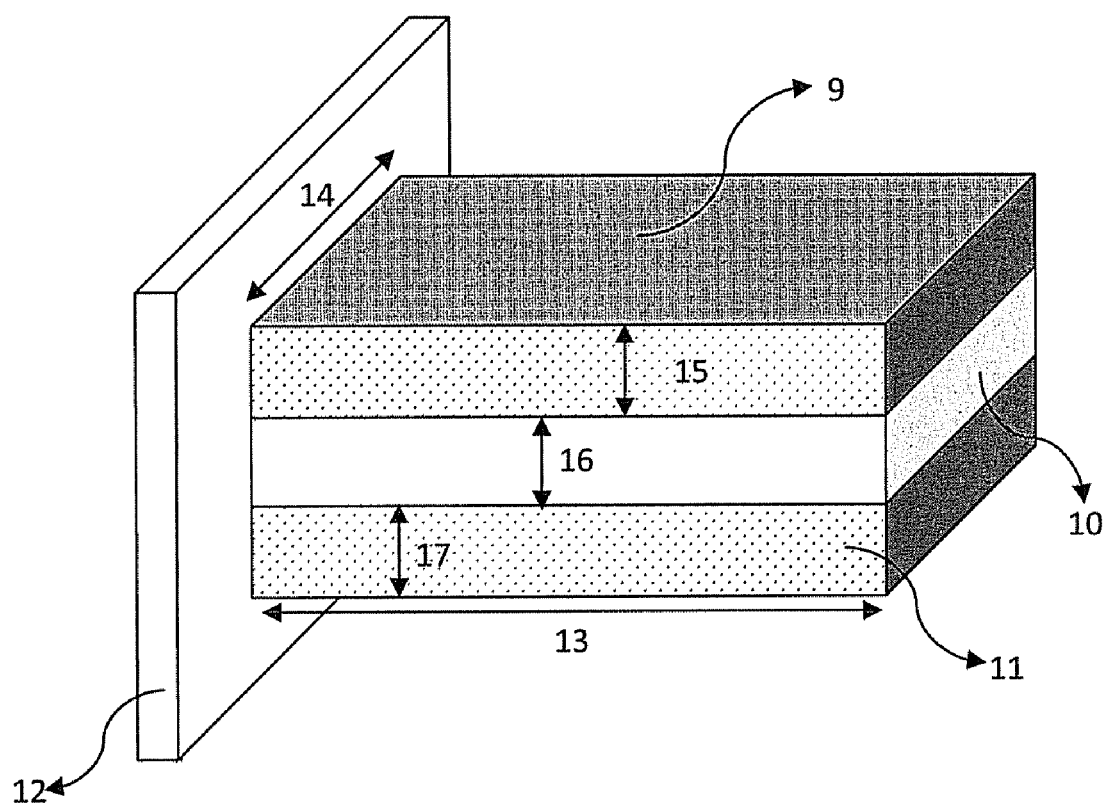
FIG. 3 is a perspective view of a piezoelectric cantilever embodiment having a plurality of component layers.

The piezoelectric cantilevers 7 in the piezoelectric element 6 can be made out of different types of piezoelectric materials. An exemplary individual cantilever is shown in FIG. 3 and additional details relating to the cantilever of FIG. 3 are discussed below. The piezoelectric layers 9, 11 are cut to a specific size depending on the application and coupled, such as by adhesive or deposition, to the top and bottom of a non-piezoelectric substrate 10. The cantilever is substantially fixed at one end 12 and the other end is free to vibrate through a plurality of modes.

Various materials can be used for piezoelectric layers 9, 11. One option for the piezoelectric layers 9, 11 is using a lead zirconate titanate piezoelectric ceramic that is industry type 5H (navy type VI) that has a relative dielectric constant of about 3800 at about 1 kHz frequency and that has a $d_{31}$ and $d_{33}$ values of about $-320\times10^{-12}$ mN (or C/N) and about $650\times10^{-12}$ m/V (or C/N). Another option for piezoelectric layer 9, 11 is a poly-crystal PMN-PT material or a single crystal PMN-PT material. In various embodiments a PMN-PT material can be used to generate electricity to power some or all of the headset circuit elements and other electrical components. Thus, in various embodiments the invention relates to electricity or power generating elements sized and configured for use in a headset.

The material for the non-piezoelectric substrate can be, but is not limited to a metal, a polymer, or a non-piezoelectric ceramic. The adhesive used between the piezoelectric 9, 11 and the non-piezoelectric substrate 10 can be a conductive or a non-conductive adhesive, or a conductive adhesive at specific areas and non-conductive adhesive at other areas depending on the specific cantilever. The width 14 of the layers 9, 10 and 11 can be equal or the widths 14 can be different.

The width 14 of the layers 9, 10, 11, as shown in FIG. 3, can vary from about 0.1 mm to about 1000 mm. More specifically, the width 14 of the layers 9, 10 and 11 can be between about 3 mm to about 14 mm. The thickness 15, 16, 17 of the layers 9, 10 and 11 can be equal or can be different. The thickness 15, 16, 17 of the individual layer 9, 10 or 11 can vary from about 1 μm to about 500 μm (1 μm (micron)=$10^{-6}$ m). More specifically, the thickness 15, 16, 17 of the individual layer 9, 10 or 11 can vary from about 5 μm to about 130 μm (micron=$10^{-6}$ m). The length 13 of the layers 9, 10 and 11 can be equal or they can be different. The length 13 of the individual layer 9, 10 or 11 can vary from about 0.1 mm to about 1000 mm. More specifically, the length 13 of the individual layer 9, 10, or 11 can vary from about 5 mm to about 100 mm. The dimensions of the piezoelectric cantilever can be modified so that the piezoelectric cantilever can have a specific resonance frequency, which would be expected to match the main vibration frequency of the headset.

Figure 4A:
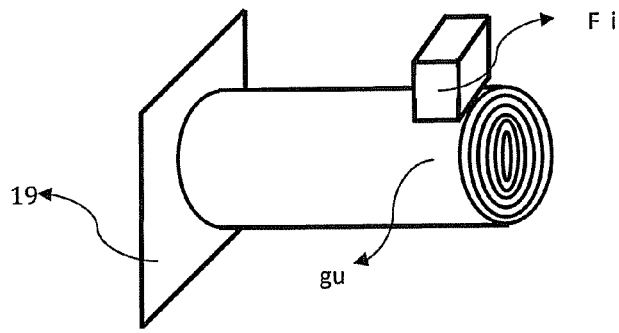
FIGS. 4a-4e are perspective views of different types of piezoelectric power generating device embodiments.

Different geometries of piezoelectric cantilevers are shown in FIGS. 4a, 4b, 4c, 4d, and 4e. FIG. 4a shows a piezoelectric cantilever of substantially cylindrical shape 18 clamped 19 at one end and with an optional mass 20, such as a proof mass, placed on the tip. This cantilever has many layers of concentric cylindrical shaped piezoelectric material disposed inside each other to increase the volume density.

Figure 4B:
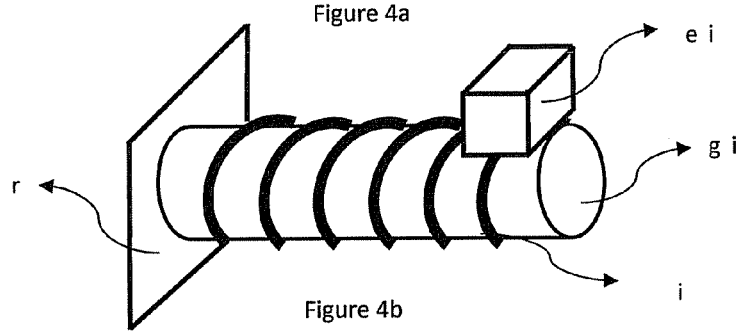
Figure 4C:
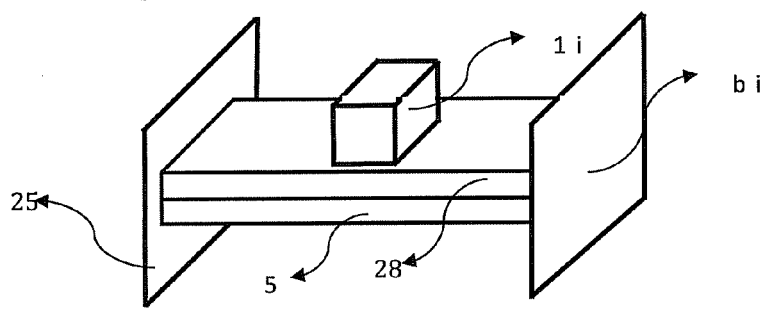
Figure 4D:
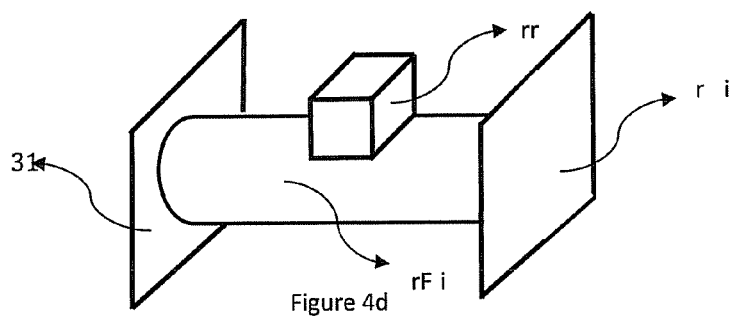
Figure 4E:
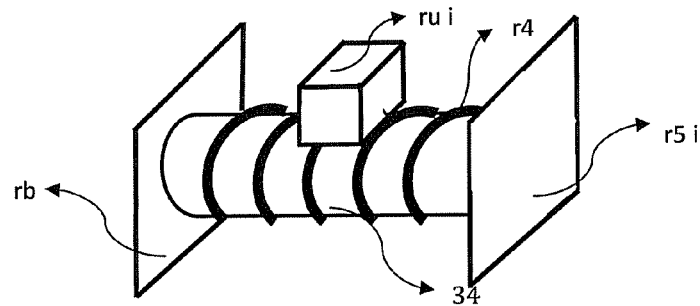

FIG. 4b shows a piezoelectric cantilever of substantially cylindrical shape that includes a solid substrate 21 with the piezoelectric material 22 woven onto the substrate 21 and clamped 23 at one end, with an optional mass 24 on the tip. FIG. 4c shows the schematic of a substantially rectangular piezoelectric cantilever, with a substrate 27 on the bottom and piezoelectric material 28 on top, clamped on both ends 25, 26 and with an optional mass 29 on top. FIG. 4d shows a substantially cylindrical shaped piezoelectric cantilever 30 clamped at both ends 31, 32 and with an optional mass 33 on top. FIG. 4e shows the schematic of a substantially cylindrical shaped substrate 34 with piezoelectric material 35 woven onto it, and clamped on both ends 36, 37 with an optional mass 38 on top.

Figure 5A:
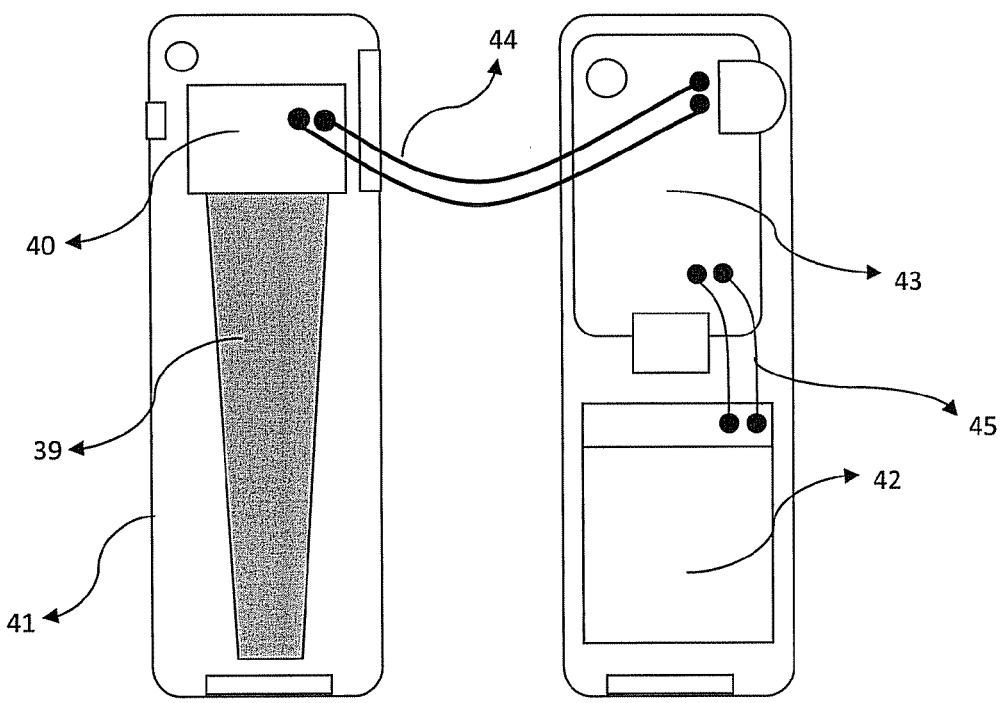
FIG. 5a is a perspective view of an open self-powering headset showing the locations of the piezoelectric cantilever, circuitry, and the battery in accordance with an embodiment of the invention.
Figure 5B:
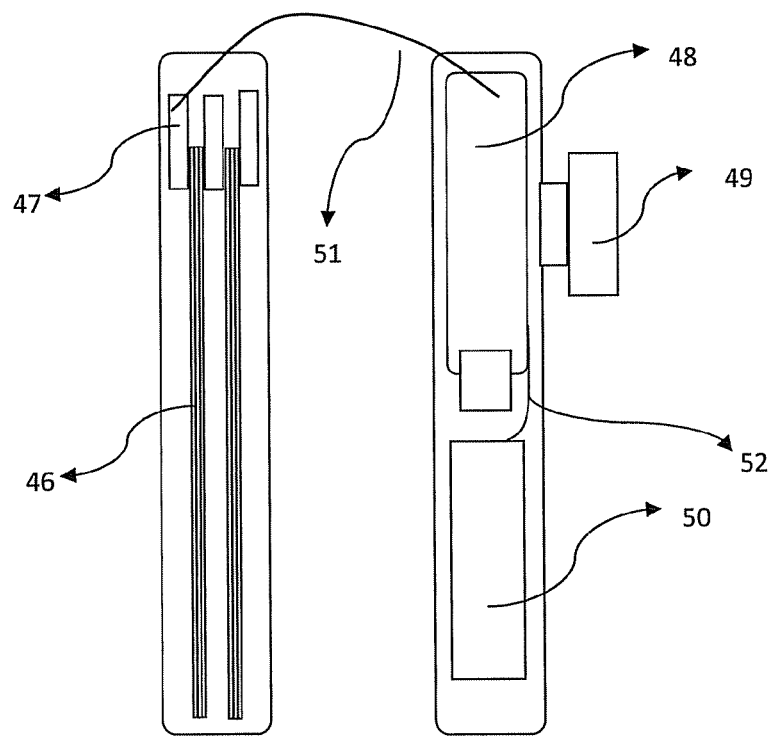
FIG. 5b is a cross-sectional view of an open self-powering headset showing the locations of the piezoelectric cantilever, circuitry, and the battery in accordance with an embodiment of the invention.

On the left, FIG. 5a shows the top view of an open headset with the piezoelectric element 39 secured by a clamp or clamping member 40 and placed in the headset housing 41 and, on the right, FIG. 5a also shows the location of the battery 42 and a portion of the headset energy harvesting circuitry 43. The piezoelectric element 39 is in electrical communication 44 with circuitry 43 to which the headset battery 42 is connected 45 to and controlled by. In one embodiment, a rectification circuit is included in the circuitry 43 to charge the battery or power up the headset. The rectification circuit may be in series or in parallel with the piezoelectric element 39. FIG. 5b shows the cross sectional view of an open headset with the piezoelectric element 46 secured with a clamp or member 47 at one end, also showing the positions of the circuitry 48, including the energy harvesting circuitry, a portion of the ear piece 49, and the battery 50. The piezoelectric element 46 is in electrical communication 51 with the circuitry 48 in the headset, to which the headset battery 50 is in electrical communication 52.

Figure 6A:
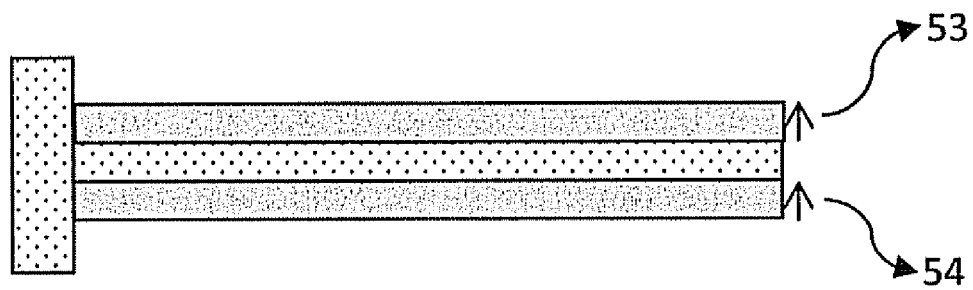
FIG. 6a is a side view of a piezoelectric cantilever when the poling directions between the top and bottom piezoelectric layers are parallel and the poling direction is from bottom to the top for each of the piezoelectric element in accordance with an embodiment of the invention.
Figure 6B:
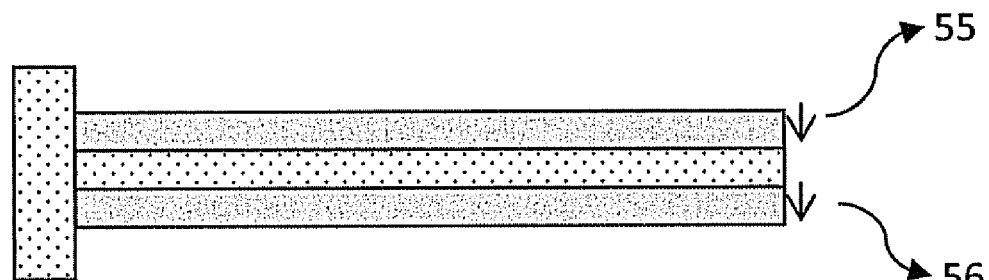
FIG. 6b is a side view of the piezoelectric cantilever when the poling directions between the top and bottom piezoelectric layers are parallel and the poling direction is from top to the bottom for each of the piezoelectric element in accordance with an embodiment of the invention.

In one embodiment, poling is aligning the dipoles in (piezoelectric) ceramics in one direction. Poling can be performed under electric field and elevated temperature conditions. The poling directions arrangement between the top 9 and bottom 11 piezoelectric layers can be different configurations as shown in FIGS. 6a, 6b, 6c and 6d. FIGS. 6a and 6b show the parallel poling directions configuration 53, 54, 55, 56 between the top and bottom piezoelectric layers 9, 11. In the parallel poling direction 53, 54, 55, 56 configuration of the piezoelectric layers 9, 11 of the piezoelectric cantilever, the piezoelectric layers 9, 11 are arranged so the poling directions of the individual piezoelectric layers are both from bottom to the top 53, 54 or from top to the bottom 55, 56. As shown in FIGS. 6a and 6b, the parallel poling direction configuration between the top 9 and bottom 11 piezoelectric layers allows the current produced on the top 9 and bottom 11 piezoelectric layers to be added, while keeping the induced voltage produced on them constant when appropriate connection between those electrodes are maintained.

Figure 6C:
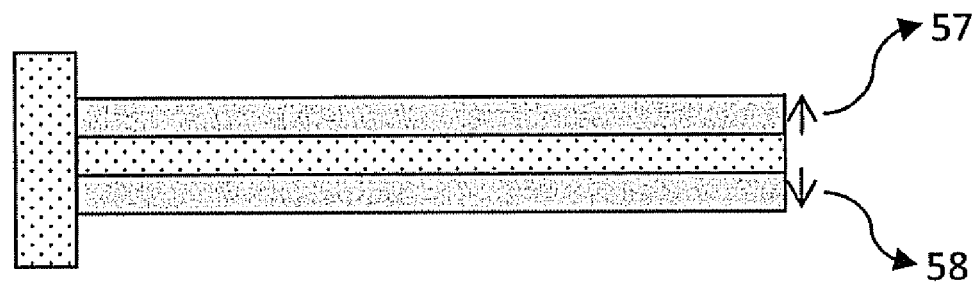
FIG. 6c is a side view of the piezoelectric cantilever when the poling directions between the top and bottom piezoelectric layers are anti-parallel and the poling direction for the top piezoelectric element is from bottom to the top and for the bottom piezoelectric element it is from top to the bottom in accordance with an embodiment of the invention.
Figure 6D:
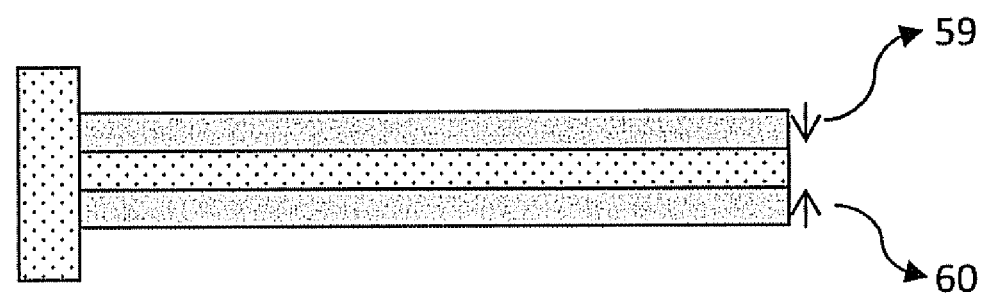
FIG. 6d is a side view of the piezoelectric cantilever when the poling directions between the top and bottom piezoelectric layers are anti-parallel and the poling direction for the top piezoelectric element is from top to the bottom and for the bottom piezoelectric element it is from bottom to the top in accordance with an embodiment of the invention.

FIGS. 6c and 6d show the anti-parallel poling directions configuration 57, 58, 59, 60 between the top and bottom piezoelectric layers 9, 11. In the anti-parallel poling direction configuration 57, 58, 59, 60 the configuration of the piezoelectric layers 9, 11 of the piezoelectric cantilever can be of two different orientations. The first possible orientation is shown in FIG. 6c. In FIG. 6c, the embodiment depicted demonstrates that the poling directions of the piezoelectric layers 9, 11 are arranged in such a way that the top layer's 9 poling direction 57 is from bottom to the top and the bottom layer's 11 poling direction 58 is from top to the bottom.

The second possible orientation is shown in FIG. 6d. Specifically, in FIG. 6d the poling directions of the piezoelectric layers 9, 11 are arranged in such a way that the top layer's 9 poling direction 59 is from top to the bottom and the bottom layer's 11 poling direction 60 is from bottom to the top. As shown in FIGS. 6c and 6d, the anti-parallel poling directions configuration between the top 9 and bottom 11 piezoelectric layers allow the induced voltage produced on the top 9 and bottom 11 piezoelectric layers to be added, while keeping the current produced on them constant when appropriate connection between those electrodes are maintained.

The wire or electrical connection for the piezoelectric cantilevers that have a parallel poling direction configuration between the top and bottom piezoelectric layers, as shown in FIGS. 6a and 6b, is such that the negative (ground) will be the non-piezoelectric layer 10 and the positive will be the top and bottom piezoelectric layers 9, 11 together. The wire or electrical connection for the piezoelectric cantilevers that have the anti-parallel poling direction configuration between the top and bottom piezoelectric layers, as shown in FIGS. 6c and 6d, is such that either the negative (ground) will be the top 9 and positive will be the bottom 11 piezoelectric layer or the negative (ground) will be the bottom 11 and the positive will be the top 9 piezoelectric layer.

Figure 7:
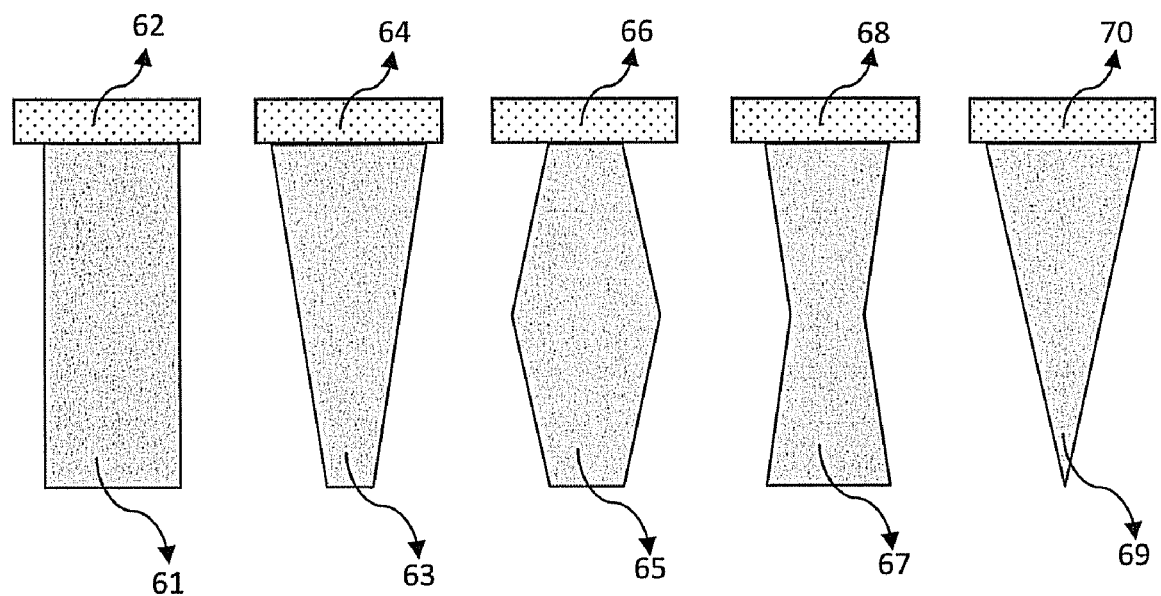
FIG. 7 is a top view of the piezoelectric cantilevers showing the different shapes of the cantilevers in accordance with an embodiment of the invention.

FIG. 7 shows a top view of different geometries of various piezoelectric cantilever embodiments. The top view of the piezoelectric cantilever can be rectangular 61, trapezoidal 63, hexagonal (outward) 65, hexagonal (inward) 67, or triangular 69. As shown in FIG. 7, all of the cantilevers are secured 62, 64, 66, 68, and 70 at one end using a clamp or other fixation element or member and kept free at the other end to facilitate vibration and power generation. The width of the trapezoidal 63, hexagonal (outward) 65, hexagonal (inward) 67, and triangular 69 shaped piezoelectric cantilevers can vary at different points which still will be between about 0.1 mm to about 1000 mm. More specifically, the width of the trapezoidal 63, hexagonal (outward) 65, hexagonal (inward) 67, and triangular 69 shaped piezoelectric cantilevers can vary at different points which still will be between 3 mm to 20 mm. There can also be masses attached to the tip of the piezoelectric cantilevers for some specific applications varying from about 0.1 grams to about 2 grams. These masses may be made out of magnetic or non-magnetic materials. Magnetic materials, as masses, provide an increase in vibration amplitude when similar polarity magnets are placed on top of (or otherwise relative to) two cantilevers due to the nature of repelling forces between similar polarity magnets.

Figure 8A:
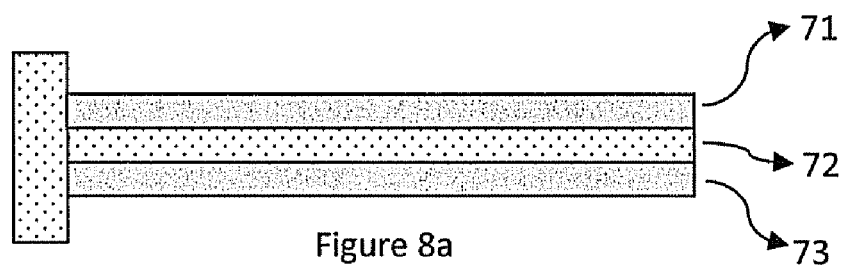
FIG. 8a is a side view of the piezoelectric cantilever in which the top and bottom piezoelectric layers are equal in length and the piezoelectric layers are glued to a middle non-piezoelectric substrate in accordance with an embodiment of the invention.
Figure 8B:
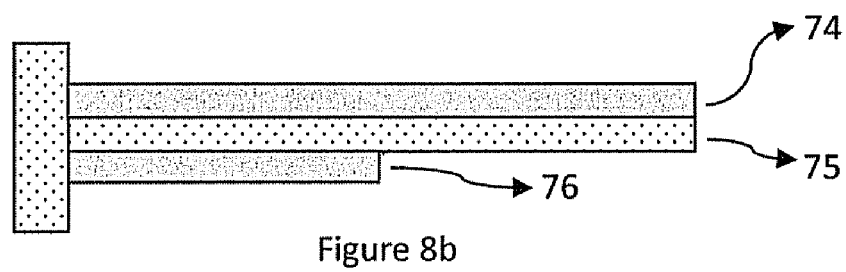
FIG. 8b is a side view of the piezoelectric cantilever in which the bottom piezoelectric layer is shorter than the top piezoelectric layer and the piezoelectric layers are glued to a middle non-piezoelectric substrate in accordance with an embodiment of the invention.

The piezoelectric cantilevers can be manufactured with or without a middle substrate layer as discussed below. FIG. 8a shows a schematic of a piezoelectric cantilever with top 71 and bottom 73 piezoelectric elements, where the piezoelectric elements 71, 73 are glued onto the non-piezoelectric substrate 72 and the piezoelectric elements 71, 73 are of equal length. FIG. 8b shows a schematic of the piezoelectric cantilever with top 74 and bottom 76 piezoelectric elements, where the piezoelectric elements 74, 76 are glued onto the non-piezoelectric substrate 75 and a bottom piezoelectric element 76 is shorter than the top piezoelectric element 74.

Figure 8C:
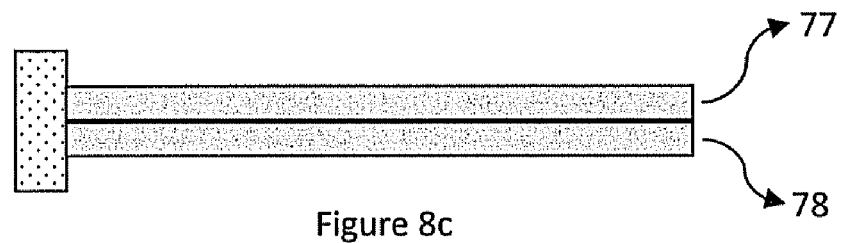
FIG. 8c is a side view of the bimorph piezoelectric cantilever in which the top and bottom piezoelectric layers are equal in length and bound together without the substrate but by using a fabrication method in accordance with an embodiment of the invention.

FIG. 8c shows the schematic of the piezoelectric cantilever where a top 77 and bottom 78 piezoelectric elements, alternatively a first and second piezoelectric element, are adhered to each other by using with no additional non-piezoelectric substrate layer in between the top 77 and bottom 78 piezoelectric layers. As shown in FIG. 8c, the top 77 and bottom 78 piezoelectric layers are of equal length.

Figure 8D:
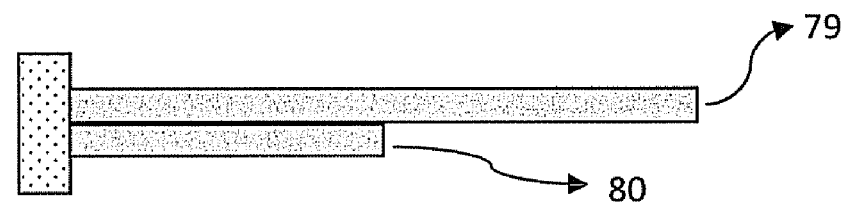
FIG. 8d is a side view of the bimorph piezoelectric cantilever in which the bottom piezoelectric layer is shorter than the top piezoelectric layer and the piezoelectric layers are bound together without the substrate but by using a fabrication method in accordance with an embodiment of the invention.

FIG. 8d show a schematic of a piezoelectric cantilever where the top 79 and bottom 80 piezoelectric layers are adhered together with no additional non-piezoelectric substrate layer in between the top 79 and bottom 80 piezoelectric layers. As shown, the bottom piezoelectric layer 80 is shorter than the top piezoelectric layer 79. The piezoelectric cantilever embodiments of FIG. 8c can be manufactured using a metal electrode material that can be laminated in between the piezoelectric layers 77, 78. This process can be repeated until the required thickness and number of piezoelectric cantilever is achieved. The top piezoelectric layer 77, 79 can be glued onto the bottom piezoelectric layer 78, 80 using a conductive or non-conductive epoxy. In another method, the metal layer that connects the top 77, 79 and bottom 78, 80 piezoelectric layers can also be laminated onto the top piezoelectric layers 77, 79 and the bottom piezoelectric layers can be laminated onto the metal layer afterwards.

Figure 9A:
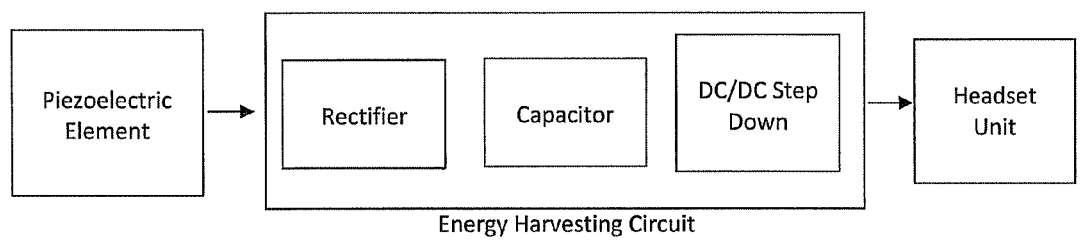
FIG. 9a is a schematic showing an exemplary energy harvesting circuit when a piezoelectric element supplies enough power to power a headset in accordance with an embodiment of the invention.
Figure 9B:
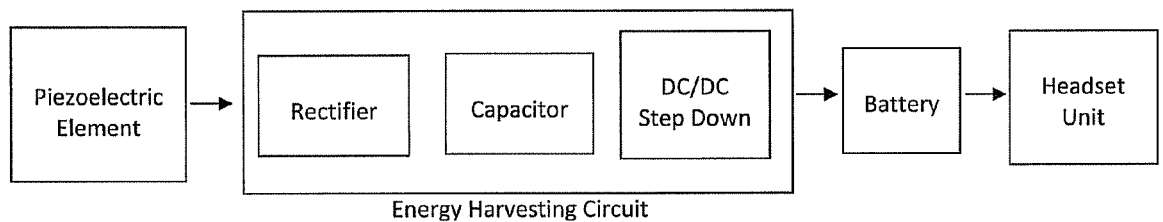
FIG. 9b is a schematic showing an exemplary energy harvesting circuit when the piezoelectric unit supplies additional power to the battery and the unit is powered via the battery in accordance with an embodiment of the invention.

In one embodiment, one or more piezoelectric cantilevers will generate random induced voltage signals that will be directed to an energy harvesting circuit, which will rectify the random signals to a DC voltage. Elements of the circuit can also temporarily store charge in a capacitive element and adjust the magnitude of the DC voltage using a DC/DC step down unit, as shown in FIGS. 9a and 9b. FIG. 9a shows a power transportation architecture with various component circuit elements. As shown in FIG. 9a, electricity flows from a piezoelectric element to the headset unit even though there is no battery inside the headset unit. A battery can be incorporated in other embodiments.

In FIG. 9a, the induced voltage produced by the piezoelectric element travels to the energy harvesting circuit first. Within the energy harvesting circuit shown, the induced voltage is first rectified and then temporarily stored into a capacitor. The capacitance of this capacitor is adjusted so that it can maintain the power required by the headset unit, since there are no batteries attached to the headset unit in this configuration. The stored voltage is then adjusted to a level suitable for the headset unit's circuitry and power needs by a DC/DC step down circuit element. The produced voltage, which originates from the piezoelectric element, is then suitable to power the headset unit.

FIG. 9b shows a power transportation architecture for a headset unit when a battery is included in the headset unit. In this embodiment, the induced voltage produced by the piezoelectric element propagates to the energy harvesting circuit. When the induced voltage reaches the energy harvesting circuit, it is first rectified and then temporarily stored using a capacitor. The capacitance of this capacitor is adjusted so that the piezoelectric element can provide continuous power to the battery, so the battery can be charged continuously. In one embodiment, this capacitance ranges from about 1 nF to about 10,000 μF. Before the rectified induced voltage enters the battery, it is adjusted to a desired level by DC/DC step down unit inside the energy harvesting circuit; to a level suitable for charging the battery while also not damaging it. The battery, which is continuously charged via the piezoelectric element, can then power the headset unit.

Figure 10A:
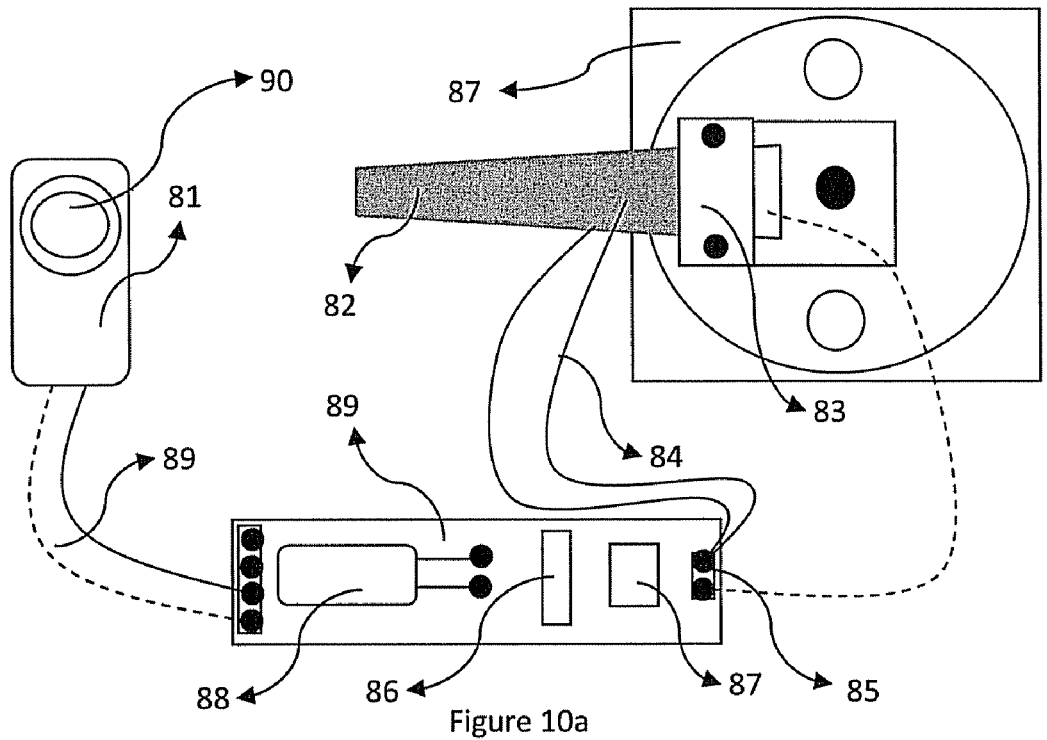
FIGS. 10a and 10b are schematics showing an embodiment in which simulated vibrations for a typical user environment are provided to power a headset unit according to an embodiment of the invention.
Figure 10B:
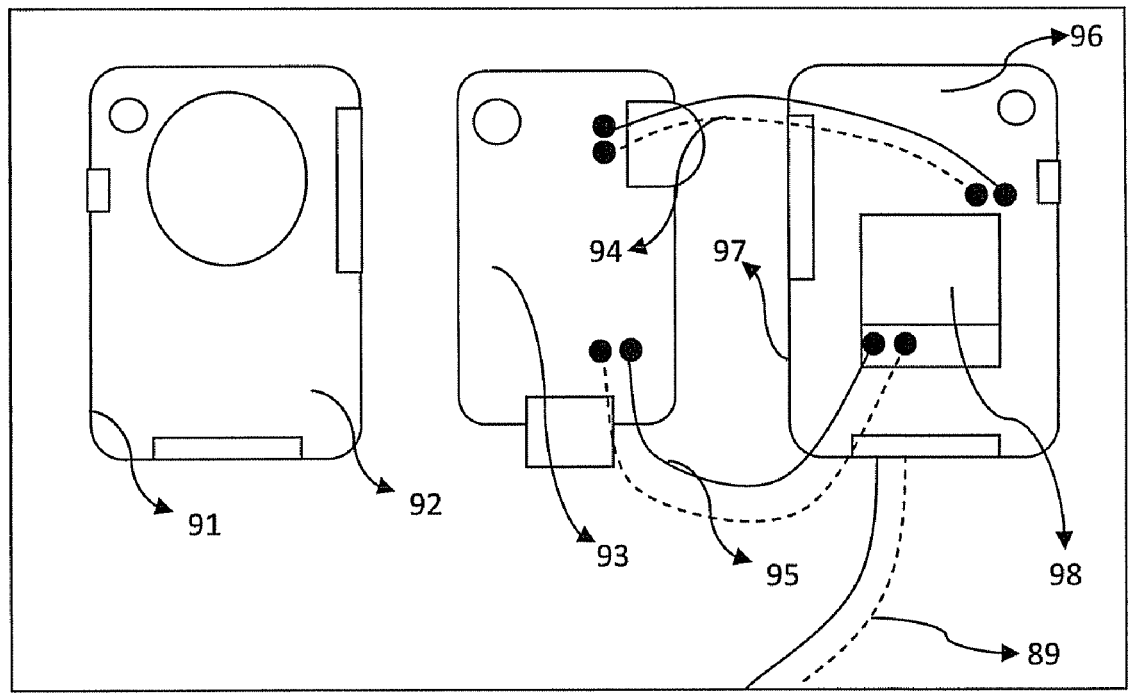

FIG. 10a shows a schematic of a disassembled arrangement of electrical and mechanical components suitable for powering a headset 81, such as a Nokia BH 208 Bluetooth headset. As shown, the headset 81 receives power from the vibrating the piezoelectric cantilever 82 attached to the electromagnetic shaker 87 by its clamp 83. The piezoelectric cantilever 82 is connected the energy harvesting circuitry 89 by electrical wires 84 at the input 85 of the circuitry 89. The circuitry 89 includes a capacitor 88, programmable element 86, and a rectifier 87. The output conditioned electrical power from the circuitry 89 is transferred to the headset 81 using the electrical wires 89. The earpiece 90 of the headset 81 is also shown in FIG. 10a. A shaker 87 is used to simulate the movement provided by a headset end user. FIG. 10b shows the top view of an open headset 81. The environmental vibrations a headset user would experience and related frequencies were simulated using an electromagnetic shaker 87. For this embodiment, the headset 81 was dissembled and extension cables 89 were used to connect directly to its internal battery 98. The top half piece 92 and top half housing 91 of the headset are shown in FIG. 10b on the left. The electronic circuitry 93 and the connection of the circuitry 94 to the bottom half piece 96 and bottom half housing 97, and also the connection 95 of the circuitry 93 to the headset battery 98 are shown in FIG. 10b.

An exemplary piezoelectric cantilever is shown in FIG. 3. The cantilever shown includes various layers that are arranged in a stack. In one example, two 127 μm PZT 5H piezoelectric sheets adhered to approximately 50 μm type 304 stainless steel sheet using conductive epoxy, as schematically shown in FIG. 3. In this embodiment, the piezoelectric cantilever 82 was trapezoidal in shape, had a top piezoelectric layer 9 and bottom 11 piezoelectric layer that were both about 13±1 mm in width at the clamping point and about 50±1 mm in length, and had a stainless steel substrate 10 that was also about 13±1 mm in width at the clamping point and about 53±1 mm in length. The poling directions of the top 9 and bottom 11 piezoelectric layers of the piezoelectric cantilever 82, as shown in FIG. 10*a*, were oriented in parallel. The piezoelectric cantilever 82 was attached to an LDS electromagnetic shaker 87 for applying vibration to the piezoelectric cantilever. The piezoelectric cantilever 82 was connected to the Advanced Linear Devices, Inc. EH300 series energy harvesting circuit 89 to harvest, optimize and temporarily store the electrical energy produced by the piezoelectric cantilever and then bring it down to the voltage level required to charge the headset battery 98, as explained in FIG. 10*b*. When the piezoelectric cantilever 82 is vibrated on the shaker 87, the electrical energy charges the initially discharged headset battery 98.

The headset battery 98 powers the headset unit 81 with the supplied electrical energy from the vibrating piezoelectric cantilever 82 which goes through the energy harvesting circuit 89 before it is delivered to the headset battery 98. When multiple cantilevers 82 are connected to the energy harvesting circuit 89 then Central Semiconductor Corp. model number CBRHDSH1-60 Schottky bridge rectifier can be used for each of the piezoelectric cantilevers 82 before they were connected to the energy harvesting circuit 89.

Using the Schottky bridge rectifier on each of the individual piezoelectric cantilevers 82 the induced voltage produced by each of them 82 can be rectified. The rectified voltages from each of the individual piezoelectric cantilevers would then be connected to the energy harvesting circuit 89 before charging up the headset battery 95 and powering up the headset unit 81. Using a Schottky bridge rectifier for each of the individual piezoelectric cantilever 82 is desirable when combining more than one piezoelectric cantilever 82 because the induced voltage produced by any piezoelectric cantilever 82 can be out of phase and can have different frequencies when compared with the induced voltage produced on any other piezoelectric cantilever 82 in the same system, during the vibration.

Figure 11A:
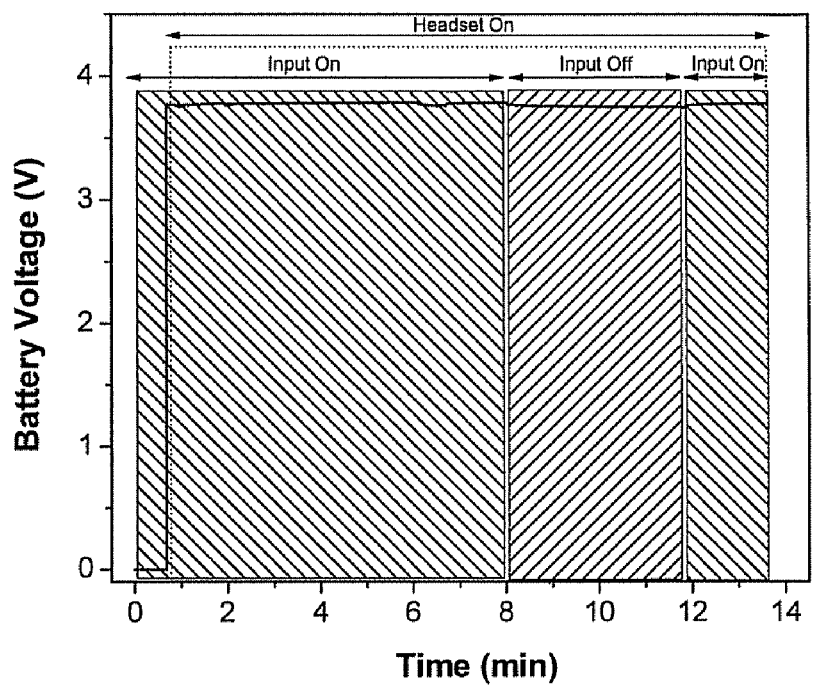
FIG. 11a is a graph showing the battery voltage vs. the time while the piezoelectric cantilever is powering the headset unit and the input is switched on an off in accordance with an embodiment of the invention.
Figure 11B:
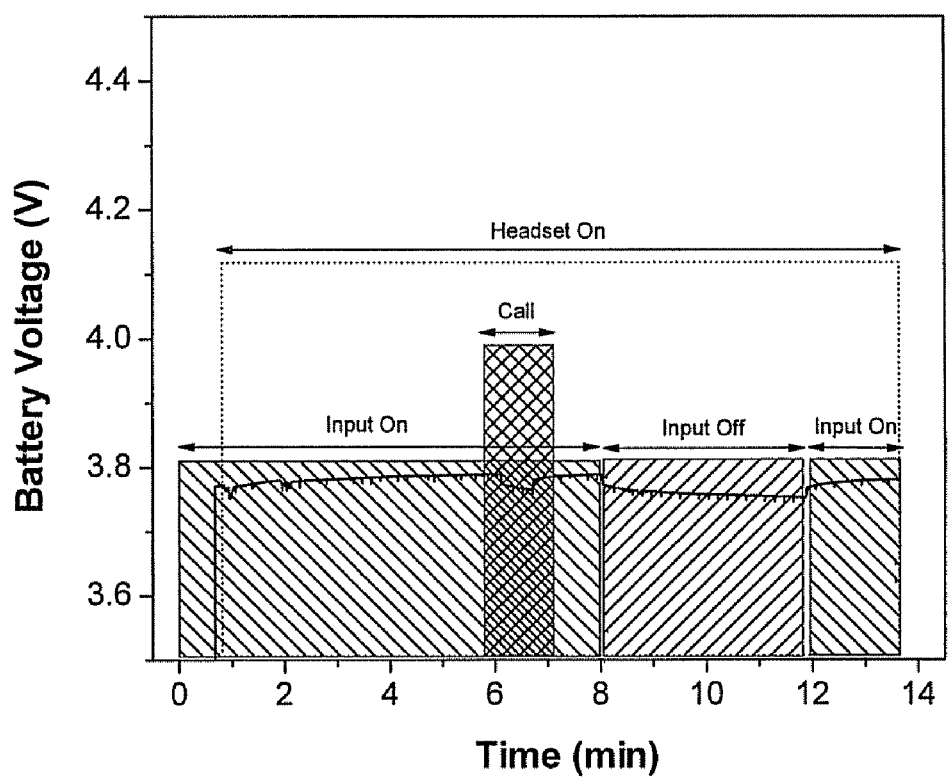
FIG. 11b is a graph showing the battery voltage vs. the time plot focused around the 3.7 V region of FIG. 11a in accordance with an embodiment of the invention.

FIGS. 11*a* and 11*b* are plots, which show the result of an energy harvesting experiment in which a Nokia BH 208 headset was charged using a single piezoelectric cantilever 82. Since only one piezoelectric cantilever was used, it was directly connected to the energy harvesting circuit 89 without any need of an individual Schottky bridge rectifier. The experiment was performed with the piezoelectric cantilever 82 connected to the 3.7 V battery of the headset and also to the headset unit through an energy harvesting circuit 89, as explained in FIG. 10*b*. The piezoelectric cantilever 82 was vibrated on the electromagnetic shaker 87 to simulate real life conditions. The data depicted in FIG. 11*a* shows that at time 0 the battery was discharged such that the battery voltage was zero. The piezoelectric cantilever 82 was subjected to vibration such that in less than about 1 minute, the battery is fully charged with the power supplied from the piezoelectric element. As soon as the battery voltage reaches about 3.7 V, the headset was turned on.

FIG. 11*b* zooms on the region of FIG. 11*a* after the headset is turned on right before the $1^{st}$ minute. The "input on" and "input off" regions in FIGS. 11*a* and 11*b* shows the regions at which the piezoelectric cantilever 82 was vibrated and supplied power to the headset unit 81 or when the piezoelectric cantilever 82 was not vibrated and not supplying any power to the headset unit 81, respectively.

In FIGS. 11*a* and 11*b*, while the piezoelectric cantilever 82 is supplying power to the battery and the headset unit indirectly, the battery voltage is steady. In contrast, as shown in FIG. 11*b*, when the piezoelectric cantilever 82 is not providing any power to the battery and the headset unit indirectly, then the battery voltage drops over time as shown in the data between the $8^{th}$ and $12^{th}$ minutes. Further, as shown in FIG. 11*b*, after 12 minutes, when the piezoelectric cantilever 82 is again supplying power to the battery, and thus powering the headset unit, the battery voltage increases back to its initial value of about 3.7 V. Thus, the piezoelectric cantilever 82 can supply enough power to charge the battery to its full state and also to keep the headset unit 81 running.

As shown in FIG. 11*b*, approximately between the $6^{th}$ and 7th minutes, that when the headset unit answers an incoming call there is a sudden drop in the battery voltage since the headset unit 81 draws more power when it is not in the stand-by mode. It is also shown in FIG. 10*b* that when the call is answered via the headset unit the voltage across the battery drops initially but then comes back to its initial value of 3.7 V. This is because the piezoelectric cantilever 82 is supplying power to the battery and to the headset unit indirectly. This demonstrates that even when the headset unit is in its active call mode, which is the mode in which it consumes the most amount of power, the piezoelectric cantilever can still power the unit via supplying power to the battery.

Figure 12A:
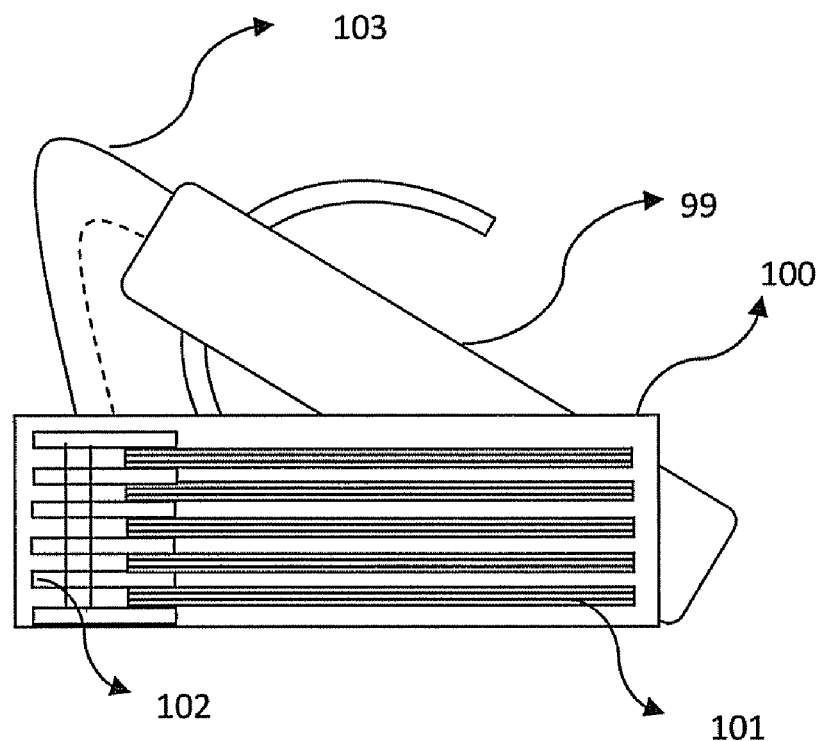
FIG. 12a is a schematic showing the cross section of the headset embodiment attached to an acrylic box, which holds the piezoelectric element in it in accordance with an embodiment of the invention.
Figure 12B:
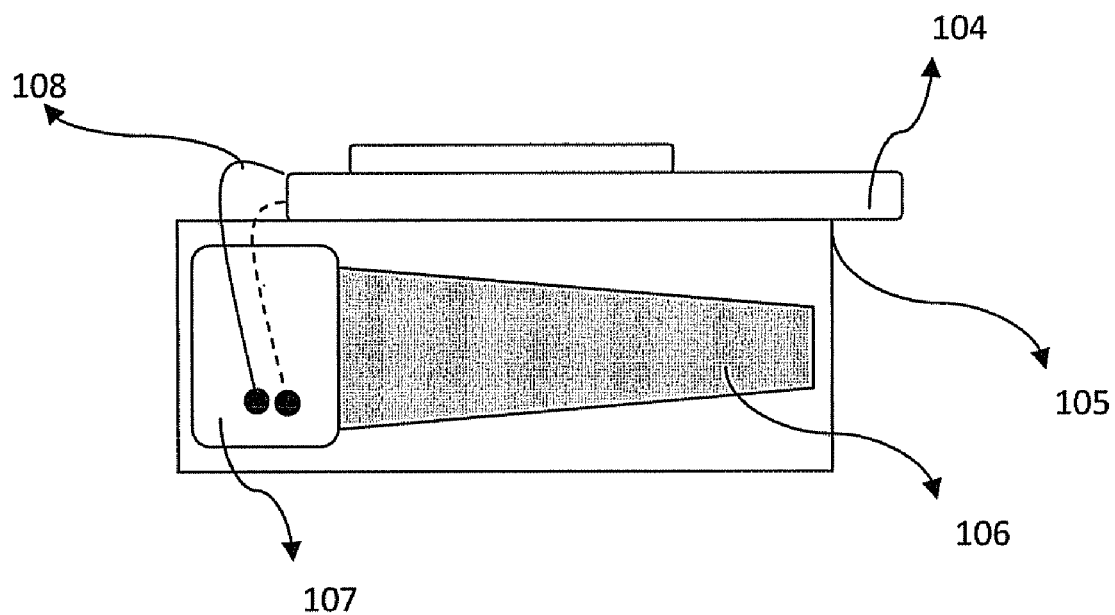
FIG. 12b is a schematic showing the top view of the headset embodiment attached to an acrylic box, which holds the piezoelectric element in it in accordance with an embodiment of invention.

One of the headset embodiments is shown in FIG. 12*a*. Specifically, in this embodiment, a Nokia BH 301 headset 99 was attached to a charging unit 100, which includes multiple piezoelectric cantilevers 101 clamped 102 inside a piezoelectric element 100. Each of the piezoelectric cantilevers 101 clamped 102 inside the piezoelectric element 100 was rectified using individual Schottky bridge rectifiers, and the rectified piezoelectric elements were then connected in series. The rectified output was directly connected 103 to the 3.7 V battery of the headset 99. FIG. 12*b* shows the top view of the headset embodiment, as shown in FIG. 12*a*. The headset 104 was connected to the piezoelectric element 104 using electrical wires 108. The piezoelectric element 105 included piezoelectric cantilevers 106 clamped 107 at one end.

Figure 13:
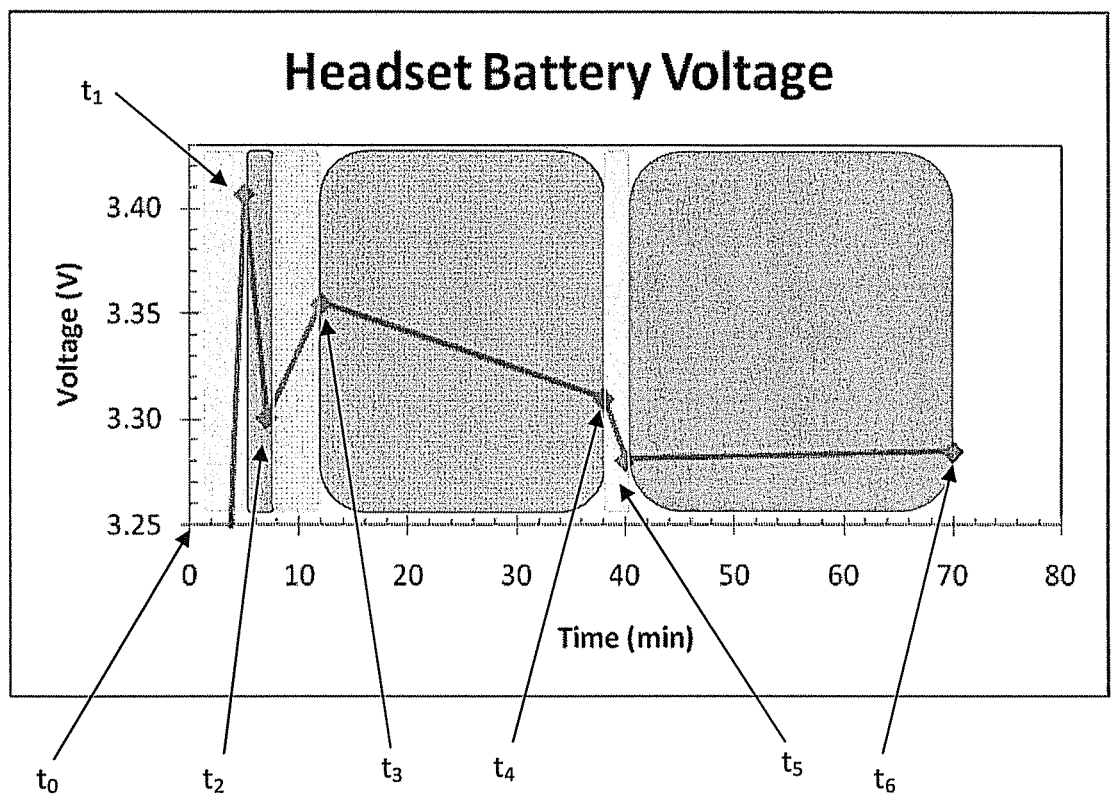
FIG. 13 is a graph showing the headset battery voltage vs. the time plot for the headset embodiment as shown in FIGS.

FIG. 13 summarizes the result of experiments done with the self-charging Nokia BH 301 headset 99 embodiment, as shown in FIG. 12*a*. The battery voltage of the headset 99 was monitored throughout the experiment. Initially, at $t_0$, the headset 99 was connected 103 to the piezoelectric element 100 through its rectified output. As shown in FIG. 13, in the first 5 minutes time, from $t_0$ to $t_1$, the headset 99 battery was charged while the embodiment was carried in the user's pocket while the user was walking. Following this, the headset 99 was turned on at time $t_1$, wirelessly linked to the user's cell phone and a one minute phone call was made using the headset 99, which caused a slight drop in the headset 99 battery voltage up to $t_2$. After the call terminated at time t2, the user walked again for five minutes, up to time t3, with the headset 99 embodiment, this time while the unit was on and paired with the phone.

As shown in FIG. 13, between the times $t_2$ and $t_3$, walking caused the piezoelectric cantilevers 101 in the piezoelectric element 100 to vibrate and, in turn, charge the headset 99 battery. Following 5 minutes of walking, the user sat down at time $t_3$ and put the embodiment on the table while the headset 99 was still on and paired with the phone. The user also adjusted the volume of the headset 99 intermediately and reactivated the connection of the headset 99 with the phone during the 20 minutes period between times $t_3$ and $t_4$. At time $t_5$ (around $37^{th}$ minute), the headset 99 was turned off while the embodiment was still on the table, and it was observed that between times t5 and t6 (between $40^{th}$ and $70^{th}$ minute) headset's 99 battery was being charged by the piezoelectric elements' 100 slow vibration on the table.

FIG. 14 is a flow chart showing the overall steps of a manufacturing process in accordance with an embodiment of the invention. The ceramic powders used to form PMN-PT are selected based on size and purity, such that sintering is promoted. Furthermore, excess lead can be added in the amount of 0.5-25 mol %, based on the molar mass of PMN, to help compensate for lead loss during sintering. The same approach can be applied to magnesium in the amount of 0.5-10 mol % excess to compensate for any magnesium losses during sintering. Before mixing the ceramic powders, a dispersion vehicle is first prepared, containing a low molecular weight (below 10,000) acrylic dispersing resin, which includes of iso-bornyl methacrylate, methyl methacrylate and other ingredients that are proprietary to the manufacturer (e.g., Rohm & Haas, Paraloid DM-55). The molecular weight of the dispersing resin can be, for example, from about 2,000 up to about 10,000 and, more preferably, between about 4,000 and about 7,000. Each molecular weight between about 2,000 and about 10,000 is specifically contemplated herein.

In one embodiment, the dispersion vehicle includes a high and low molecular weight acrylic resin and solvent. The low molecular weight resin is considered a "dispersing resin." There is additional acrylic binder (or resin) added in the later in the process. A portion of the letdown resin is added to the dispersion vehicle, which is a high molecular weight (above 100,000) acrylic resin containing methacrylic acid ester monomers of 4 carbon atoms or higher; i.e., long chain alcohol (4 or more carbon atoms in the chain) esters of methacrylic acid (e.g., iso-butyl methacrylate, normal-butyl methacrylate, or copolymers of the two).

Examples of resins suitable for the dispersion vehicle are: Rohm & Haas, Paraloid F-10; Lucite, Elvacite 2044; Lucite, Elvacite 2045; Lucite, Elvacite 2046. The ratios of the low molecular weight resin and the high molecular weight resin are such that they yield 1-10% based on the powder weight and 0-15% based on the weight of the powder, respectively. The resins used in the invention are soluble in VOC (Volatile Organic Content) exempt and non-HAP (Hazardous Air Pollutant) solvents. Examples of such suitable solvents, include, but are not limited to tertiary butyl acetate, diacetone alcohol, normal butyl acetate, PM acetate, and lactate esters.

The amount of solvent required is based on the process method. For instance, if processing via ball milling, the amount of solvent is adjusted such that the powder loading in the mill base includes 50-75 wt. % of ceramic powders. If a paste is desired (e.g., three-roll mill processing) the solvent amount is simply reduced. If the three-roll milling process is used, the solvent is adjusted such that the powder loaded into the mill base is 90-98 wt. % ceramic powder.

NON-LIMITING EXAMPLE

In one specific embodiment, for a piezoelectric cantilever, the parameters were as follows:

| | |
|---|---|
| Cantilever Length | about 53 mm |
| Top Cantilever Length | about 50 mm |
| Bottom Cantilever Length | about 50 mm |
| Cantilever Width | about 13 mm (at the clamp) |
| Top Cantilever Capacitance | about 102.4 nF |
| Top Cantilever Loss (D) Value @ 1 kHz | about 15.4 mU (1.54%) |
| Bottom Cantilever Capacitance | about 103.1 nF |
| Bottom Cantilever Loss (D) Value @ 1 kHz | about 17.2 mU (1.72%) |
| First Resonance Frequency | about 76 Hz |
| Second Resonance Frequency | about 254 Hz |
| Third Resonance Frequency | about 381 Hz |
| Fourth Resonance Frequency | about 443 Hz |

This is only one example set of parameters and is not intended to limit the applicability of using piezoelectric elements to power a headset.

While the invention has been described with reference to illustrative embodiments, it will be understood by those skilled in the art that various other changes, omissions and/or additions may be made and substantial equivalents may be substituted for elements thereof without departing from the spirit and scope of the invention. In addition, many modifications may be made to adapt a particular situation or material to the teachings of the invention without departing from the scope thereof. Therefore, it is intended that the invention not be limited to the particular embodiment disclosed for carrying out this invention, but that the invention will include all embodiments falling within the scope of the appended claims. Moreover, unless specifically stated any use of the terms first, second, etc. do not denote any order or importance, but rather the terms first, second, etc. are used to distinguish one element from another.

What is claimed is:

1. A piezoelectric headset power source, the headset having a headset housing, the headset power source comprising a mounting surface, the mounting surface sized to fit within the headset housing; a plurality of cantilevers, the plurality of cantilevers substantially secured to the mounting surface, the plurality of cantilevers arranged such that the plurality of cantilevers can vibrate and produce an aggregate electric charge flow, wherein the plurality of cantilevers are arranged in overlapping stepped layers of varying lengths; and an energy harvesting circuit, the energy harvesting circuit comprising a first circuit element, the first circuit element receives the aggregate electric charge flow and converts the aggregate electric charge flow such that a current suitable for powering the headset is generated.

2. The headset power source of claim 1 wherein each of the plurality of cantilevers comprises a polycrystalline lead magnesium niobate-lead titanate piezoelectric material.

3. The headset power source of claim 2 wherein the polycrystalline lead magnesium niobate-lead titanate piezoelectric material has a density that ranges from about 7.6 grams/cc to about 8.0 grams/cc.

4. The headset power source of claim 2 wherein the polycrystalline lead magnesium niobate-lead titanate piezoelectric material has a density of about 7.8 grams/cc.

5. The headset power source of claim 2 wherein the polycrystalline lead magnesium niobate-lead titanate piezoelectric material has an average grain size of about 4.3 microns.

* * * * *